(12) United States Patent
Chabot (10) Patent No.: US 8,583,998 B2
(45) Date of Patent: Nov. 12, 2013

(54) SYSTEM AND METHOD FOR VITERBI DECODING USING APPLICATION SPECIFIC EXTENSIONS

(75) Inventor: Xavier Chabot, Dublin, CA (US)

(73) Assignee: NXP, B.V., Eindhoven (NL)

( * ) Notice: Subject to any disclaimer, the term of this patent is extended or adjusted under 35 U.S.C. 154(b) by 266 days.

(21) Appl. No.: 13/131,882

(22) PCT Filed: Dec. 3, 2009

(86) PCT No.: PCT/IB2009/055472
§ 371 (c)(1),
(2), (4) Date: May 31, 2011

(87) PCT Pub. No.: WO2010/064205
PCT Pub. Date: Jun. 10, 2010

(65) Prior Publication Data
US 2011/0231741 A1    Sep. 22, 2011

Related U.S. Application Data

(60) Provisional application No. 61/119,522, filed on Dec. 3, 2008.

(51) Int. Cl.
*H03M 13/03*    (2006.01)

(52) U.S. Cl.
USPC .......................................... 714/795; 714/786

(58) Field of Classification Search
USPC .................................................. 714/795, 786
See application file for complete search history.

(56) References Cited

U.S. PATENT DOCUMENTS

| 7,043,682 | B1 * | 5/2006 | Ferguson | 714/796 |
| 7,185,260 | B2 * | 2/2007 | Coombs et al. | 714/755 |
| 8,201,064 | B2 * | 6/2012 | Ferguson | 714/795 |
| 2003/0028844 | A1 * | 2/2003 | Coombs | 714/796 |
| 2005/0049843 | A1 * | 3/2005 | Hewitt et al. | 703/14 |
| 2005/0157823 | A1 | 7/2005 | Sudhakar | |
| 2007/0250689 | A1 * | 10/2007 | Aristodemou et al. | 712/221 |

FOREIGN PATENT DOCUMENTS

| EP | 1 322 041 A1 | 6/2003 |
| WO | 01/67619 A1 | 9/2001 |

OTHER PUBLICATIONS

Salmela, P.; Jarvinen, T.; Sipila, T.; Takala, J., "256-state rate 1/2 Viterbi decoder on TTA processor," Application-Specific Systems, Architecture Processors, 2005. ASAP 2005. 16th IEEE International Conference on , vol., No., pp. 370,375, Jul. 23-25, 2005.*

Forney Jr., G. "The Viterbi Algorithm", Proc. of the IEEE, vol. 61, No. 3, pp. 268-278 (Mar. 1973).

Alston, M. et al. "Implementing the Viterbi Algorithm on General Purpose Parallel Computers", SPIE, vol. 1770, pp. 134-149 (1992).

Intel Corp. "Using the Streaming SIMD Extensions 2 (SSE2) to Evaluate a Hidden Markov Model with Viterbi Decoding", retrieved from the Internet at: http://homepages.cae.wise.edu/{ece734/mmx/w_hmm_viterbi.pdf, 41 pgs. (Jul. 2000).

(Continued)

*Primary Examiner* — Cynthia Britt (57) ABSTRACT

A system and method for Viterbi decoding utilizes a general purpose processor with application specific extensions to perform Viterbi decoding operations specified in a Viterbi decoding algorithm stored in memory.

20 Claims, 8 Drawing Sheets

(56) References Cited

OTHER PUBLICATIONS

Valenti, M., et al. "The UMTS Turbo Code and an Efficient Decoder Implementation Suitable for Software-Defined Radios", Int'l. J. of Wireless Information Networks, vol. 8, No. 4, pp. 203-215 (Oct. 2001).

Texas Instruments "TMS320C64x DSP Viterbi-Decoder Coprocessor (VCP) Reference Guide", 57 pages (Sep. 2004).

Karn, Phil "Fec-3.0.1.tar.bz2", Internet Article, URL: http://www.ka9q.net/code/fec/ , 1 page, (Aug. 2007).

International Search Report for Int'l. Patent Appln. No. PCT/IB2009/055472 xxx.

* cited by examiner

SYSTEM AND METHOD FOR VITERBI DECODING USING APPLICATION SPECIFIC EXTENSIONS

Embodiments of the invention relate generally to electronic systems and, more particularly, to a system and method for Viterbi decoding using application specific extensions.

Viterbi decoding is used for decoding convolutional codes and solving estimation problems for a variety of applications such as software digital radios and pattern recognitions. Because Viterbi decoding puts computing burdens on general purpose processors, external hardware may be implemented to perform Viterbi decoding. However, the external hardware puts restrictions on Viterbi decoding software optimization, reduces Viterbi decoding software portability, and increases development costs for interfacing with the general purpose processors and risks associated with system integration.

Thus, there is a need for a system and method for Viterbi decoding that assists Viterbi decoding software optimization, improves Viterbi decoding software portability, and lowers development costs for interfacing with the general purpose processors and system integration risks.

A system and method for Viterbi decoding utilizes a general purpose processor with application specific extensions to perform Viterbi decoding operations specified in a Viterbi decoding algorithm stored in memory.

In an embodiment, a Viterbi decoding system comprises memory and a general purpose processor. The memory is configured to store a Viterbi decoding algorithm, wherein the Viterbi decoding algorithm specifies a plurality of Viterbi decoding operations. The general purpose processor comprises a plurality of application specific extensions, wherein each application specific extension is configured to perform at least one of the Viterbi decoding operations specified in the Viterbi decoding algorithm stored in the memory. The Viterbi decoding system is configured such that all the Viterbi decoding operations specified in the Viterbi decoding algorithm are performed exclusively within the general purpose processor using at least one of the application specific extensions.

In an embodiment, a method for Viterbi decoding using application specific extensions comprises (a) obtaining a Viterbi decoding algorithm, wherein the Viterbi decoding algorithm specifies a plurality of Viterbi decoding operations and (b) exclusively performing the plurality of Viterbi decoding operations within a general purpose processor using a plurality of application specific extensions in the general purpose processor.

In an embodiment, a Viterbi decoding system comprises memory and a general purpose processor. The memory is configured to store a Viterbi decoding algorithm, wherein the Viterbi decoding algorithm specifies a plurality of Viterbi decoding operations. The general purpose processor comprises a processor core and a plurality of application specific extensions, wherein the processor core includes a plurality of functional units and each application specific extension is configured to perform one of the Viterbi decoding operations specified in the Viterbi decoding algorithm stored in the memory. The Viterbi decoding system is configured such that all the Viterbi decoding operations specified in the Viterbi decoding algorithm are performed exclusively within the general purpose processor using at least one of the application specific extensions.

Other aspects and advantages of embodiments of the present invention will become apparent from the following detailed description, taken in conjunction with the accompanying drawings, illustrated by way of example of the principles of the invention.

Throughout the description, similar reference numbers may be used to identify similar elements.

Figure 1:
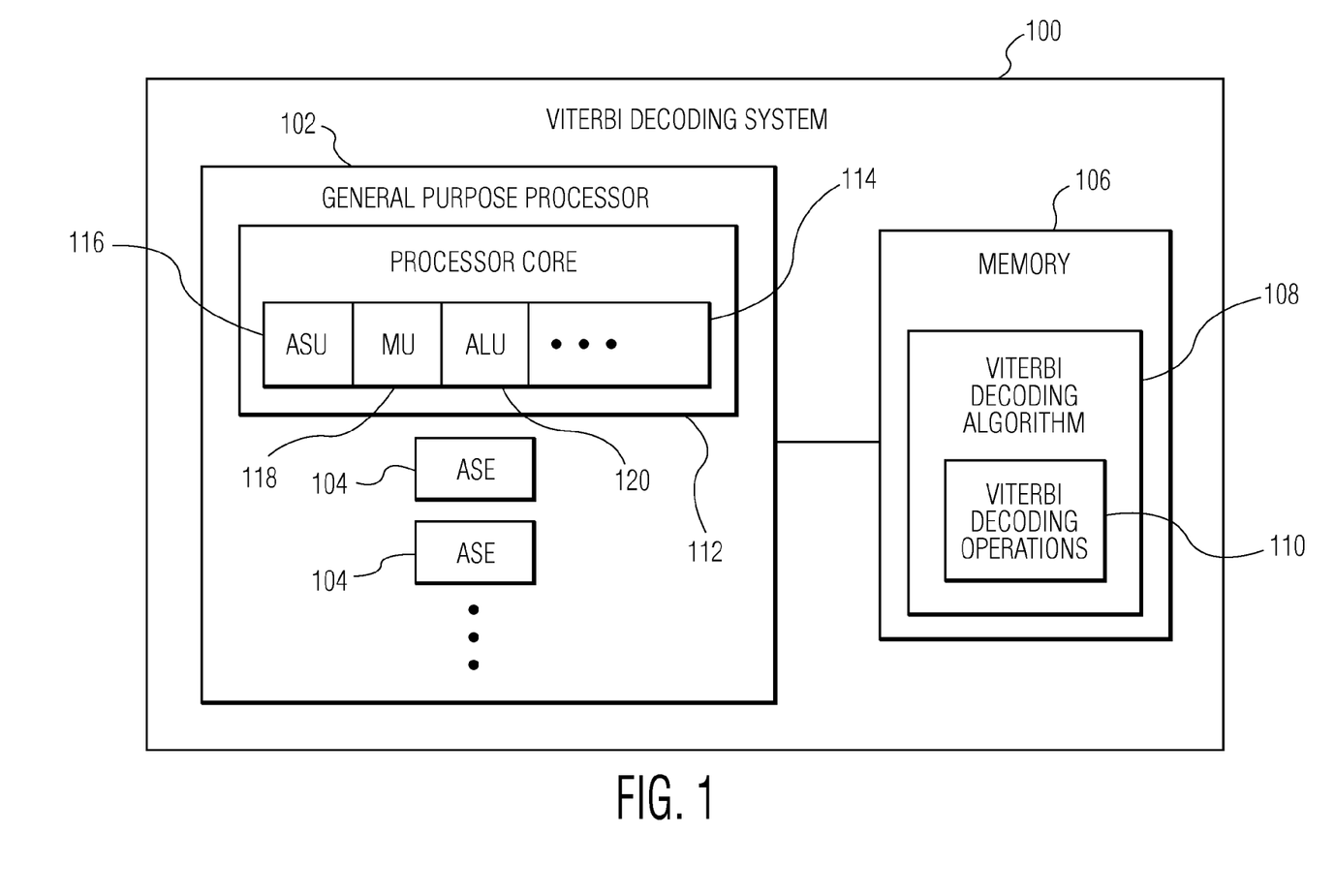
FIG. 1 illustrates a Viterbi decoding system using a general purpose processor with application specific extensions in accordance with an embodiment of the invention.

With reference to FIG. 1, a Viterbi decoding system 100 using a general purpose processor 102 with application specific extensions 104 in accordance with an embodiment of the invention is described. Embodiments of the Viterbi decoding system can be applied to various electronic systems, in particular, pattern recognition systems based on a finite state Markov process and digital communication systems. Example applications of the various electronic systems may include image recognition, speech recognition, musical melody recognition, forward error correction, and software digital radio.

As shown in FIG. 1, the Viterbi decoding system 100 includes memory 106 and the general purpose processor 102, which is not tied to a particular application. The memory is configured to store a Viterbi decoding algorithm 108 that specifies Viterbi decoding operations 110 to be performed by the general purpose processor. An exemplary Viterbi decoding algorithm is described in detail below with reference to FIG. 2. The general purpose processor includes applications specific extensions (ASEs) 104 and a processor core 112. Each ASE is configured to perform at least one of the Viterbi decoding operations specified in the Viterbi decoding algorithm stored in the memory. The processor core includes functional units 114, such as an addition/subtraction functional unit (ASU) 116 to perform addition functions and subtraction functions, a multiplication functional unit (MU) 118 to perform multiplication functions, and an arithmetic logic functional unit (ALU) 120 to perform logic functions. All the Viterbi decoding operations specified in the Viterbi decoding algorithm are performed exclusively within the general purpose processor using at least one of the application specific extensions.

The ASEs 104 may be implemented in hardware and/or software. In some embodiments, each ASE may be a set of processor instructions for the general purpose processor 102, where the set of processor instructions perform a Viterbi decoding operation specified in the Viterbi decoding algorithm 108 stored in the memory 106. In some embodiments, the ASEs may reuse existing functional units 114 in the processor core 112, which will result in more efficient source code that better utilizes processor resources, more flexible and portable software, and less risk than to develop and to integrate more complex hardware in a system-on-chip (SoC).

Figure 2:
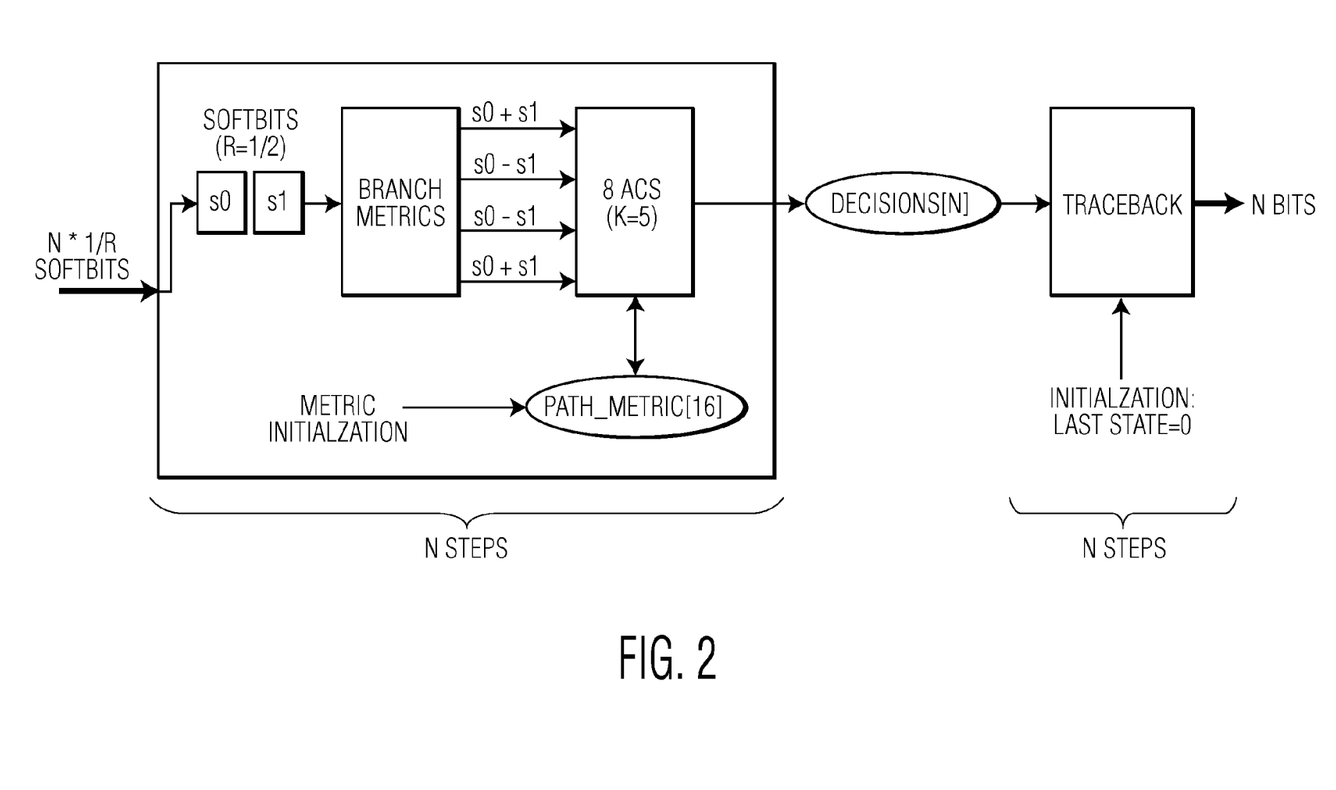
FIG. 2 illustrates the Viterbi decoding process of the Viterbi decoding algorithm stored in the memory of FIG. 1 in accordance with an embodiment of the invention.

FIG. 2 illustrates the Viterbi decoding process of the Viterbi decoding algorithm 108 stored in the memory 106 of FIG. 1 in accordance with an embodiment of the invention. In this embodiment, the Viterbi decoding algorithm includes three processes, a branch metric process, an add-compare-select (ACS) process, and a traceback process. According to the operation sequence of the Viterbi decoding algorithm, the first process is the branch metric process, which pads input values for omitted data and computes branch metric values from each depunctured group of input values. The second process is the ACS process, which loops through a block of input branch metrics and builds a trellis of possible paths. The third process is the traceback process, which starts from a known last value and goes back through the trellis of possible paths to select at each step the most likely output bit. In the illustrated embodiment of FIG. 2, the Viterbi decoding algorithm processes N*1/R softbits, where N and 1/R are two integers that are greater than zero. For instance, as in the case of FIG. 2, When 1/R is equal to 2, the branch metric process computes branch metric values for the two softbits $S_0$ and $S_1$ and outputs the branch metric values $S_0+S_1$, $S_0-S_1$, $_1-S_0-S_1$, and $-S_0+S_1$ to the ACS process. The ACS process involves processing the branch metric values from the branch metric process and metric initiation information from a sixteen-bit Path_metric data word and outputs decision bits. The traceback process involves processing the decision data bits from the ACS process and initiation state information and outputting N bits. The number of processing steps of the branch metric process and the ACS process is N and the number of processing steps of the traceback process is N.

The Viterbi decoding algorithm 108 specifies Viterbi decoding operations for the general purpose processor. In some embodiments, the Viterbi decoding operations specified in the Viterbi decoding algorithm include Viterbi decoding branch metric summing and subtracting operations that may be used in the branch metric process, Viterbi decoding ACS operations that may be used in the ACS process, and Viterbi decoding bit manipulating operations that may be used in the traceback process.

Each ASE 104 of the general purpose processor 102 performs at least one of the Viterbi decoding operations specified in the Viterbi decoding algorithm 108. Embodiments of the ASEs may perform Viterbi decoding branch metric summing and subtracting operations, Viterbi decoding ACS operations, and Viterbi decoding bit manipulating operations specified in the Viterbi decoding algorithm.

Embodiments of the ASEs 104 that are configured to perform Viterbi decoding branch metric summing and subtracting operations are first described.

A "SADDSUBR2_DUAL16 ASE" in accordance with an embodiment of the invention is configured to perform a Viterbi decoding branch metric summing and subtracting operation on two sixteen-bit input data blocks A and B, which are packed into a thirty two-bit input data word, to generate two sixteen-bit output data blocks C and D, which are packed in a thirty two-bit output data word, where C=A+B, D=A−B. In some embodiments, the "SADDSUBR2_DUAL16" ASE computes branch metric for code rate R=½ Viterbi decoding systems. In some embodiments, the "SADDSUBR2_DUAL16" ASE may perform the Viterbi decoding branch metric summing and subtracting operation using saturating sixteen-bit arithmetic.

A "SADDSUBR4_QUAD16" ASE in accordance with an embodiment of the invention is configured to perform a Viterbi decoding branch metric summing and subtracting operation on four sixteen-bit input data blocks A, B, C, and D, which are packed into two thirty two-bit input data words, to generate four sixteen-bit output data blocks E, F, G, and H, which are packed in two thirty two-bit output data words, where E=A+B+C+D, F=A+B+C−D, G=A+B−C+D, and H=A+B−C−D. In some embodiments, the "SADDSUBR4_QUAD16" ASE computes half of the needed branch metrics for code rate R=¼ Viterbi decoding systems. A "SADDSUBR4N_QUAD16" ASE described below computes the other values. In some embodiments, the "SADDSUBR4_QUAD16" ASE may perform the Viterbi decoding branch metric summing and subtracting operation using saturating sixteen-bit arithmetic.

The "SADDSUBR4N_QUAD16" ASE in accordance with an embodiment of the invention is configured to perform a Viterbi decoding branch metric summing and subtracting operation on four sixteen-bit input data blocks A, B, C, and D, which are packed into two thirty two-bit input data words, to generate four sixteen-bit output data blocks E, F, G, and H, which are packed in two thirty two-bit output data words, where E=A−B+C+D, F=A−B+C−D, G=A−B−C+D, and H=A−B−C−D. In some embodiments, the "SADDSUBR4N_QUAD16" ASE computes half of the needed branch metrics for code rate R=¼ Viterbi decoding systems. The "SADDSUBR4_QUAD16" ASE described above computes the other values. In some embodiments, the "SADDSUBR4N_QUAD16" ASE may perform the Viterbi decoding branch metric summing and subtracting operation using saturating sixteen-bit arithmetic.

A "SADDSUBR4_QUAD8" ASE in accordance with an embodiment of the invention is configured to perform a Viterbi decoding branch metric summing and subtracting operation on four eight-bit input data blocks A, B, C, and D, which are packed into a thirty two-bit data word, to generate four eight-bit output data blocks E, F, G, and H, which are packed in a thirty two-bit output data word, where E=A+B+C+D, F=A+B+C−D, G=A+B−C+D, and H=A+B−C−D. In some embodiments, the "SADDSUBR4_QUAD8" ASE computes half of the needed branch metrics for code rate R=¼ Viterbi decoding systems. A "SADDSUBR4N_QUAD8" ASE described below computes the other values. In some embodiments, the "SADDSUBR4_QUAD8" ASE may perform the Viterbi decoding branch metric summing and subtracting operation using saturating eight-bit arithmetic.

The "SADDSUBR4N_QUAD8" ASE in accordance with an embodiment of the invention is configured to perform a Viterbi decoding branch metric summing and subtracting operation on four eight-bit input data blocks A, B, C, and D, which are packed into a thirty two-bit data word, to generate four eight-bit output data blocks E, F, G, and H, which are packed in a thirty two-bit output data word, where E=A−B+C+D, F=A−B+C−D, G=A−B−C+D, and H=A−B−C−D. In some embodiments, the "SADDSUBR4N_QUAD16" ASE computes half of the needed branch metrics for code rate R=¼ Viterbi decoding systems. The "SADDSUBR4_QUAD8" ASE described above computes the other values. In some embodiments, the "SADDSUBR4N_QUAD8" ASE may perform the Viterbi decoding branch metric summing and subtracting operation using saturating eight-bit arithmetic.

A "SADDSUBR4_OCT8" ASE in accordance with an embodiment of the invention is configured to perform a Viterbi decoding branch metric summing and subtracting operation on four eight-bit input data blocks A, B, C, and D, which are packed into a thirty two-bit input data word, to generate eight eight-bit output data blocks E, F, G, H, I, J, K, and L, which are packed in two thirty two-bit output data words, where E=A+B+C+D, F=A+B+C−D, G=A+B−C+D, H=A+B−C−D, I=A−B+C+D, J=A−B+C−D, K=A−B−C+D, and L=A−B−C−D. In some embodiments, the "SADDSUBR4_OCT8" ASE computes half of the needed branch metrics for code rate R=¼ Viterbi decoding systems. The other branch metrics may be computed by negating some of the elements of the E, F, G, H, I, J, K, and L data blocks. In some embodiments, the "SADDSUBR4_OCT8" ASE may perform the Viterbi decoding branch metric summing and subtracting operation using saturating eight-bit arithmetic.

Embodiments of the ASEs 104 that are configured to perform Viterbi decoding bit manipulating operations are now described.

Figure 3:
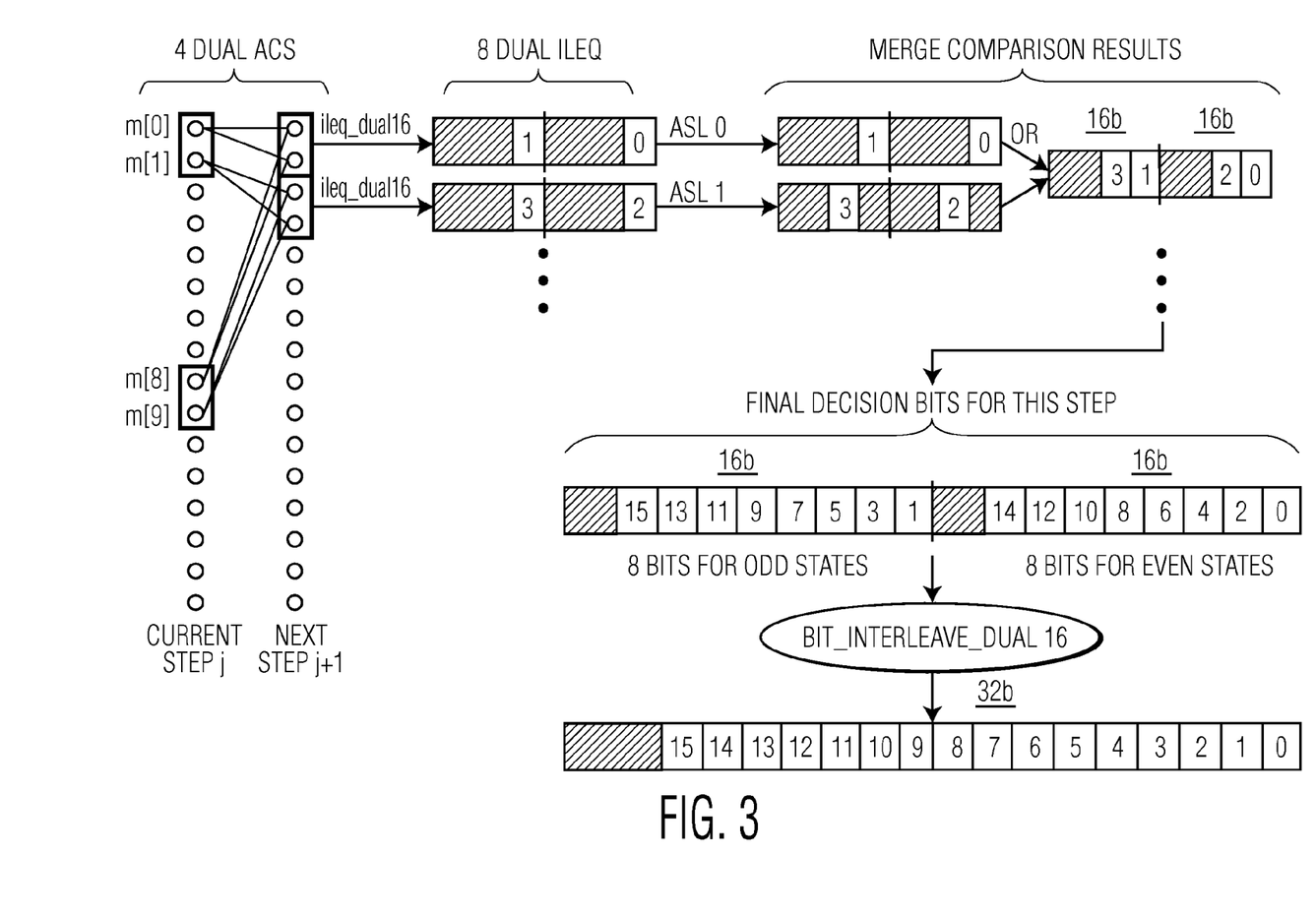
FIG. 3 illustrates a part of the Viterbi decoding process using a "BIT_INTERLEAVE_DUAL16" application specific extension in the general purpose processor in accordance with an embodiment of the invention.

A "BIT_INTERLEAVE_DUAL16" ASE is configured to perform a Viterbi decoding bit interleaving operation on two sixteen-bit input data blocks A and B, which are packed into a thirty two-bit input data word, to generate a thirty two-bit output data words C, where each bit of C is taken in turn from A and B, for example, C[0]=A[0], C[1]=B[0], C[2]=A[1], C[3]=B[1], C[4]=A[2], C[5]=B[2], etc., which can be mathematically expressed as C[I]=B[(I−1)/2] and C[J]=A[J/2], where I is an odd integer from one and thirty one and J is an even integer from zero to thirty. FIG. 3 illustrates a part of the Viterbi decoding process using the "BIT_INTERLEAVE_DUAL16" ASE in accordance with an embodiment of the invention. As shown in FIG. 3, a sequence of dual sixteen-bit integer less or equal logic test (ILEQ) processes the results of dual ACS operations and generates decision bits that are not in order and need to be interleaved. The "BIT_INTERLEAVE_DUAL16" ASE collects the decision bits from the dual sixteen-bit ILEQ and interleaves the decision bits into decision words.

A "BIT_INTERLEAVE_QUAD8" ASE in accordance with an embodiment of the invention is configured to perform a Viterbi decoding bit interleaving operation on four eight-bit input data blocks A, B, C, and D, which are packed into a thirty two bit input data word, to generate a thirty two-bit output data word E, where each bit of E is taken in turn from A, B, C, and D, for example, E[0]=A[0], E[1]=B[0], E[2]=C[0], E[3]=D[0], E[4]=A[1], AND E[5]=B[1]. In some embodiment, a sequence of quad eight-bit ILEQ may generate decision bit that are not in order and need to be interleaved and the "BIT_INTERLEAVE_QUAD8" ASE may collect the decision bits from the ILEQ and interleave the decision bits into decision words.

Figure 4:
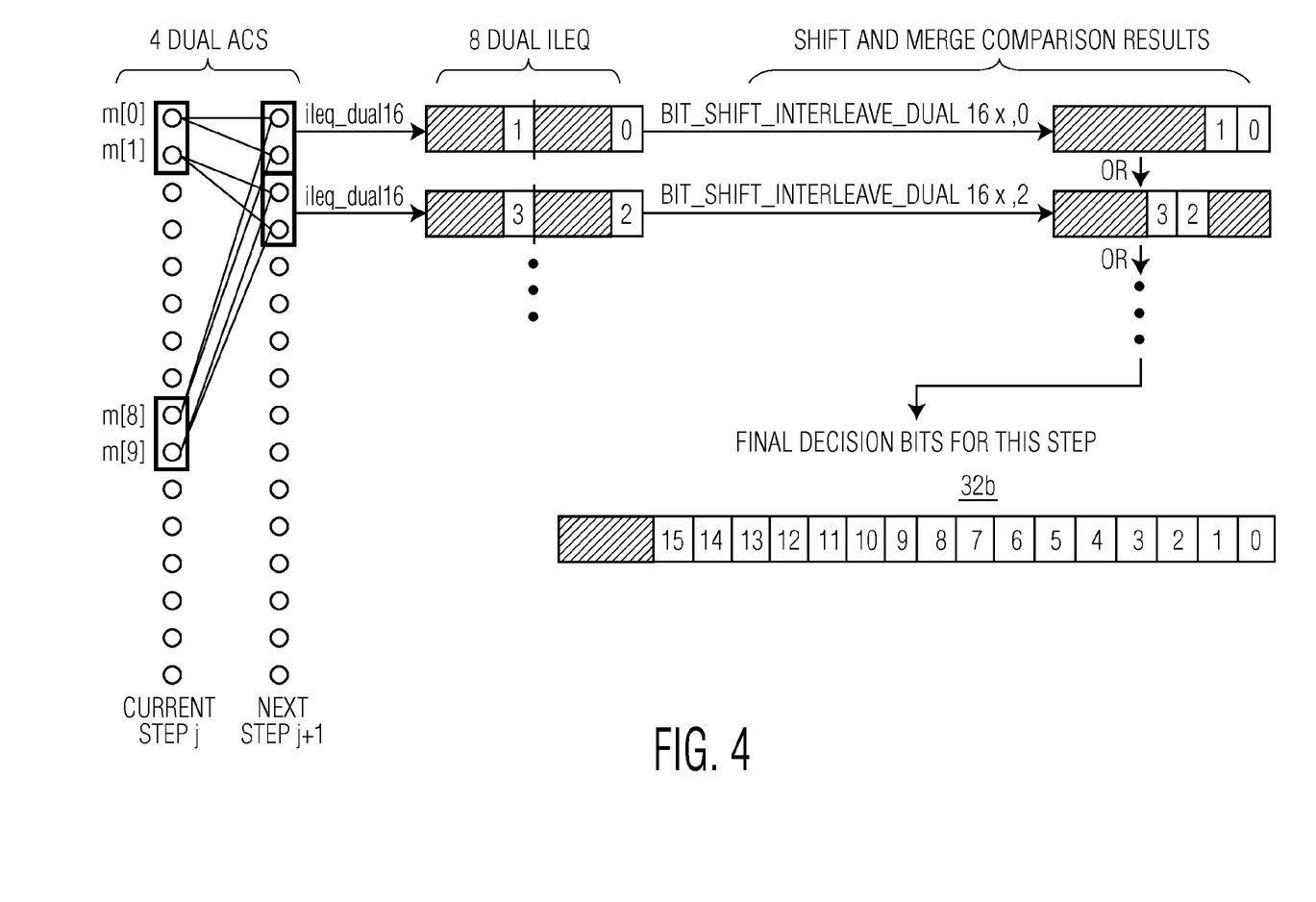
FIG. 4 illustrates a part of the Viterbi decoding process using a "BIT_SHIFT_INTERLEAVE_DUAL16" application specific extension in the general purpose processor in accordance with an embodiment of the invention.

A "BIT_SHIFT_INTERLEAVE_DUAL16" ASE is configured to perform a Viterbi decoding bit shift interleaving operation on two sixteen-bit input data blocks A and B packed into a thirty two-bit first input data word and a thirty two-bit second input data word, which includes an integer N that is greater or equal to zero and smaller than thirty one, to generate a thirty two-bit output data word C, where C[N]=ext32b(A[0])<<N, C[N+1]=ext32b(B[0])<<N+1, and all other bits of C are reset to 0, where the ext32b function extends a bit into a thirty two-bit data word. In some embodiments, N is a Viterbi decoding state number. FIG. 4 illustrates a part of the Viterbi decoding process using the "BIT_SHIFT_INTERLEAVE_DUAL16" ASE in accordance with an embodiment of the invention. As shown in FIG. 4, a sequence of dual sixteen-bit ILEQ processes the results of dual ACS operations and generates decision bits that are not in order and need to be interleaved. The "BIT_SHIFT_INTERLEAVE_DUAL16" ASE shifts the decision bits from the dual sixteen-bit ILEQ and interleaves the decision bits into decision words.

A "BIT_SHIFT_INTERLEAVE_QUAD8" ASE in accordance with an embodiment of the invention is configured to perform a Viterbi decoding bit shift interleaving operation on four eight-bit input data blocks A, B, C, and D packed into a thirty two-bit first input data word, and a thirty two-bit second input data word, which includes an integer N that is greater or equal to zero and smaller than twenty nine, to generate a thirty two-bit output data word E, where E[N]=ext32b(A[0])<<N, E[N+1]=ext32b(B[0])<<N+1, E[N+2]=ext32b(C[0])<<N+2, E[N+3]=ext32b(D[0])<<N+2, and all other bits of E are reset to 0, where the ext32b function extends a bit into a thirty two-bit data word. In some embodiments, N is a Viterbi decoding state number. In some embodiments, the "BIT_SHIFT_INTERLEAVE_QUAD8" ASE shifts the decision bits from quad eight-bit ILEQ and interleaves the decision bits into decision words.

A "VSTATE2BIT" ASE in accordance with an embodiment of the invention is configured to perform a Viterbi decoding bit manipulating operation on a thirty two-bit unsigned integer input data word A and a thirty two-bit second input data word, which includes an integer N that is greater or equal to zero and smaller than thirty two, to generate a thirty two output data word B, where B=A|1<<N. In some embodiments, N is a Viterbi decoding state number. In some embodiments, the "VSTATE2BIT" ASE performs the decoding bit manipulating operation at the traceback process to accumulate decoded bits packed into thirty two-bit words. In some embodiments, the "VSTATE2BIT" ASE used to set the N decoded bit in a thirty two-bit unsigned "decodedbits" input data word, using the parity of the current state stored in the "state" variable, if (state&0x1) decodedbits=VSTATE2BIT(decodedbits,N). In other words, if the "state" variable is odd, the Nth bit is set to one. If the "state" variable is even, the Nth bit is unchanged and left to its initial value, which should be zero.

A "VNEXTSTATE_LE" ASE in accordance with an embodiment of the invention is configured to perform a Viterbi decoding bit manipulating operation on a thirty two-bit unsigned integer first input data word and a thirty two-bit second input data word, which includes an integer N that is greater or equal to zero and smaller than thirty two, to generate a thirty two-bit output data word, where N is the current state for the current step and the output is the most likely state of the previous step (this is part of backtracking, i.e., going backwards through the steps produced by the ACS process, where each step corresponds to one decoded bit). Each state has two possible next states in the previous step.

Figure 5:
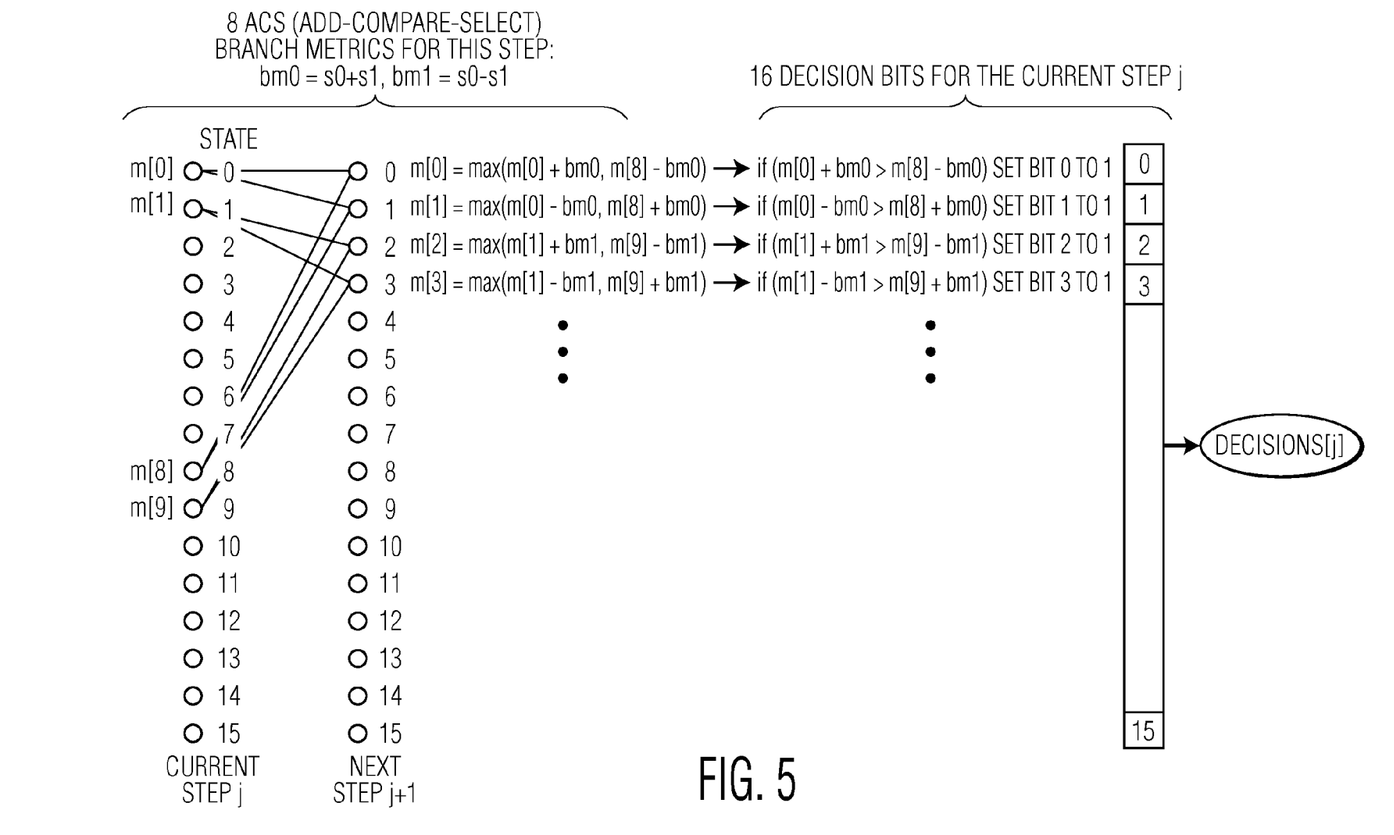
FIG. 5 illustrates a part of the Viterbi decoding process using a "VNEXTSTATE_LE" application specific extension in the general purpose processor on a little endian add-compare-select pattern in accordance with an embodiment of the invention.
Figure 6:
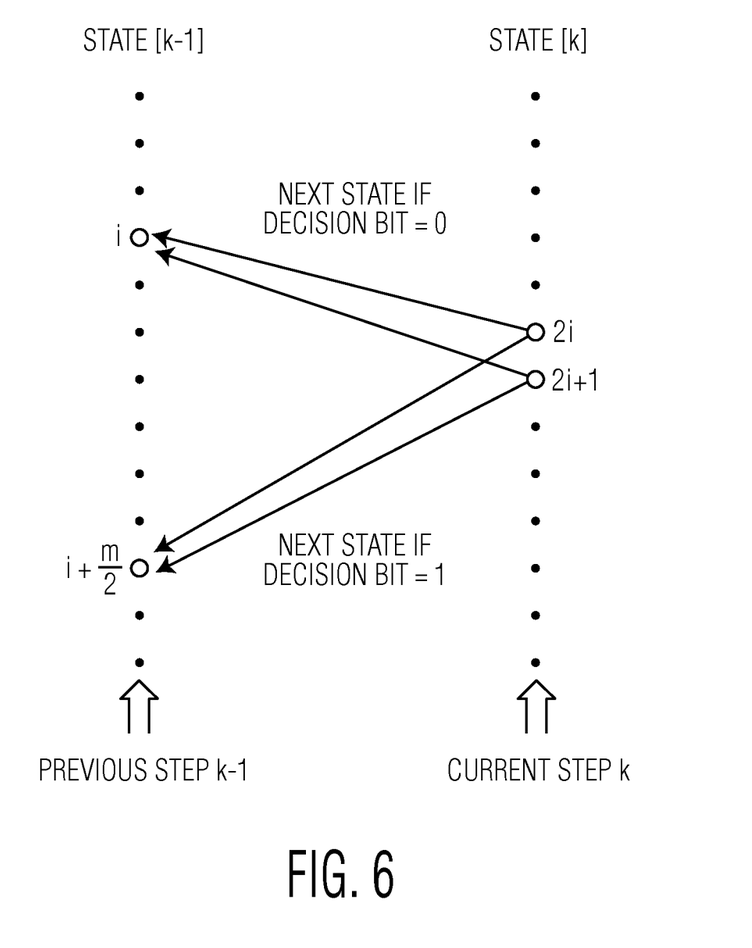
FIG. 6 illustrates a part of the Viterbi decoding process using the "VNEXTSTATE_LE" application specific extension in the general purpose processor on a little endian traceback pattern in accordance with an embodiment of the invention.

FIG. 5 and FIG. 6 illustrate a part of the Viterbi decoding process using the "VNEXTSTATE_LE" application specific extension in the general purpose processor on a little endian ("LE") add-compare-select (ACS) pattern and a "LE" traceback pattern in accordance with an embodiment of the invention. FIG. 5 shows a "LE" ACS pattern with which the ACS process creates the path metric and the decision bits. The traceback process is going backwards through this pattern. As shown in FIG. 5, the "LE" ACS pattern includes the path metric for the state pair <i, i+M/2> used to compute the path metric for the state pair <2i, 2i+1>, where i is a "state"

variable and "M" is the total number of possible states. FIG. 6 shows a "LE" traceback pattern, which can be performed by the "VNEXTSTATE_LE" ASE. As shown in FIG. 6, the "LE" traceback pattern goes backwards from <2i, 2i+1> to <i, i+M/2>. In other words, the "LE" traceback pattern uses the decision bit for one state in a <2i, 2i+1> pair. The "LE" traceback pattern sets the "next state" to be an upper state <i> if the decision bit for the current state is zero. The "LE" traceback pattern sets the "next state" to be a lower state <i+M/2> if the decision bit for the current state is set to one.

In some embodiments, N is a Viterbi decoding state number. In some embodiments, the "VNEXTSTATE_LE" ASE is used for instance to find which state is most likely to be preceding the current state, using the value of the decision bit for that state, nextstate=VNEXTSTATE_LE (decisions, state). As used herein, "next state" means the next state after the current state during the traceback process, which is actually the previous state of the current state. The Viterbi decoding bit manipulating operation performed by the "VNEXTSTATE_LE" ASE may be described by the following C code excerpt,

```
unsigned int VNEXTSTATE_LE(unsigned int decisions, unsigned int state)
{
    If(decision & 1<<state) {
        If(state&1) return (state – 1)/2 + M/2;
        Else return state/2 + M/2;
    } else {
        If (state & 1) return (state –1)/2;
        Else return state/2;
    }
}
```

Figure 7:
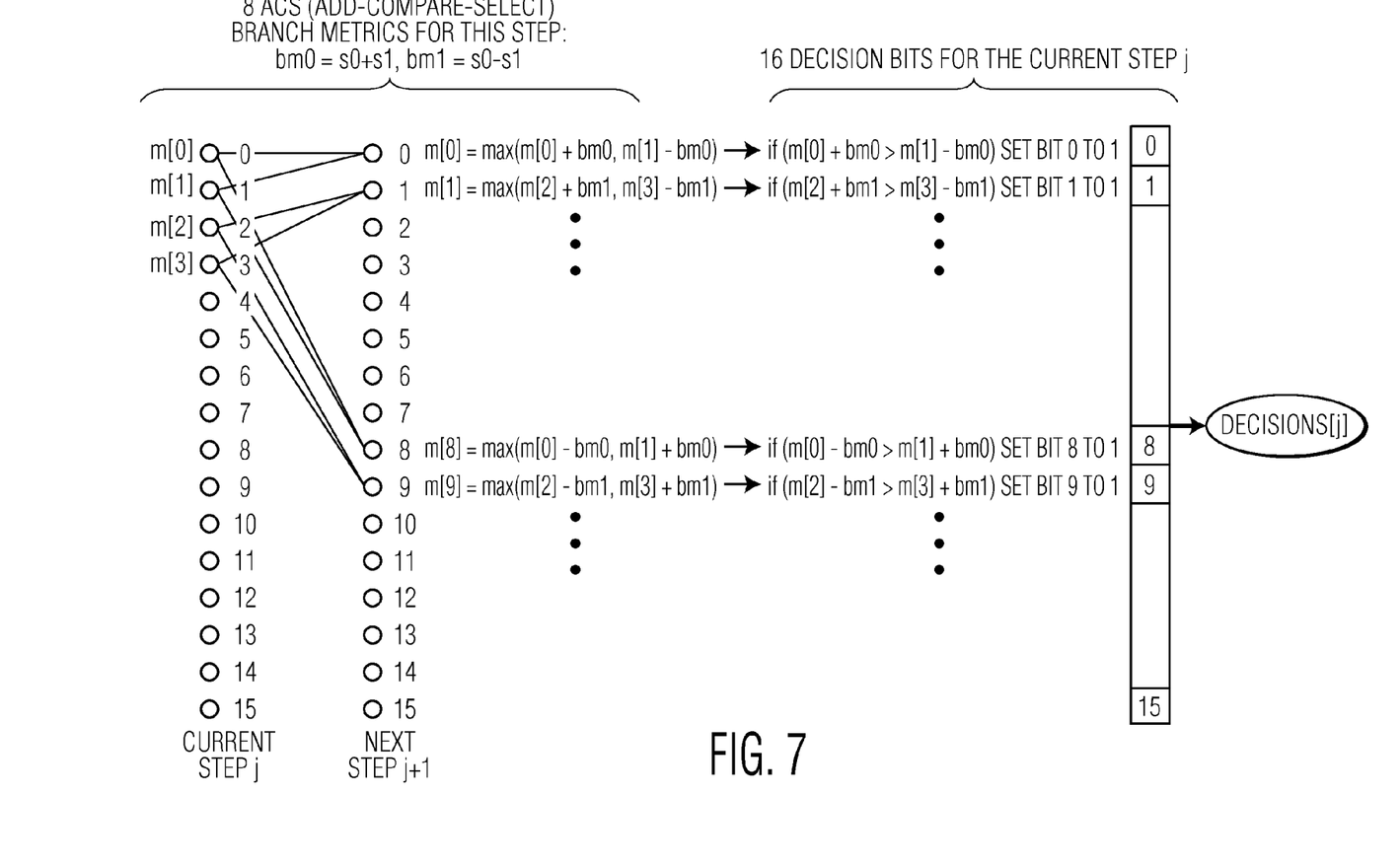
FIG. 7 illustrates a part of Viterbi decoding using a "VNEXTSTATE_BE" application specific extension in the general purpose processor on a big endian add-compare-select pattern in accordance with an embodiment of the invention.
Figure 8:
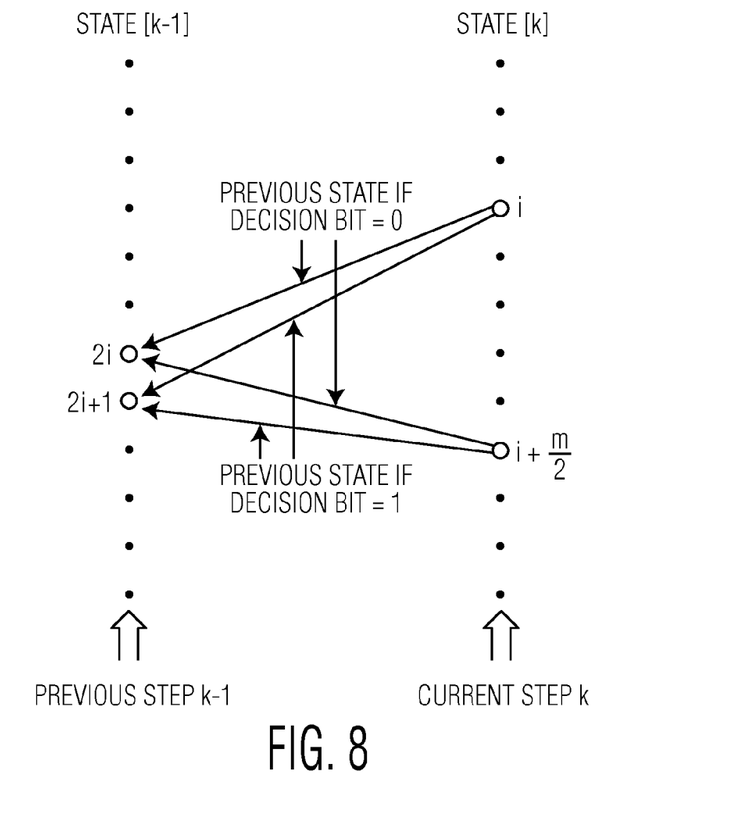
FIG. 8 illustrates a part of Viterbi decoding using the "VNEXTSTATE_BE" application specific extension in the general purpose processor on a big endian traceback in accordance with an embodiment of the invention.

FIG. 7 and FIG. 8 illustrate a part of Viterbi decoding using a "VNEXTSTATE_BE" application specific extension in the general purpose processor on a big endian ("BE") add-compare-select pattern and a "BE" traceback in accordance with an embodiment of the invention. FIG. 7 shows a "BE" ACS pattern with which the ACS process has created the path metric and the decision bits. The "BE" ACS pattern takes the path metric for the state pair <2i, 2i+1> and computes the metric for the state pair <i, i+M/2>. FIG. 8 shows a "BE" traceback pattern that can be performed by a "VNEXTSTATE_BE" ASE. The BE traceback pattern goes backwards: if the current state if one of <i, i+M/2>, the "next" state in the traceback is an "upper" state <2i> if the decision bit for the current state is zero, and the next state is an "lower" state <2i+1> if the decision bit for the current state is one. In some embodiments, the "VNEXTSTATE_BE" ASE is used for instance to find which state is most likely to be preceding the current state, using the value of the decision bit for that state, nextstate=VNEXTSTATE_BE (decisions, state), where N is a Viterbi decoding state number. The Viterbi decoding bit manipulating operation performed by the "VNEXTSTATE_BE" ASE may be described by the following C code excerpt,

```
unsigned int VNEXTSTATE_BE(unsigned int decisions, unsigned int state)
{
    If (decision & 1<<state)
    {
        If (state & M/2) return 2* state – M/2 +1;
        Else return 2*state +1;
    } else {
        If (state & M/2) return 2* state – M/21;
        Else return 2*state ;
    }
}
```

An "ORI_QUAD32" ASE in accordance with an embodiment of the invention is configured to perform a Viterbi decoding bit manipulating operation on four thirty two-bit input data words A, B, C, D to generate a thirty two-bit output data word E, which is the logical OR combination of the four input data words into, E=A|B|C|D. In some embodiment, the "ORI_QUAD32" ASE is used to combine results from the ASEs performing Viterbi decoding bit interleaving operations and the ASEs Viterbi decoding bit shift interleaving operations described above.

Embodiments of the ASEs that are configured to perform Viterbi decoding ACS operations are now described.

A "VACS_DUAL16" ASE in accordance with an embodiment of the invention is configured to perform a Viterbi decoding ACS operation on four sixteen-bit path metric input data blocks packed in two thirty two-bit input data words and also using two branch metric data blocks packed into a thirty two-bit branch metric data word to generate four sixteen-bit path metric output data block packed in two thirty two-bit output data words. The "VACS_DUAL16" ASE performs the Viterbi decoding ACS operation in parallel on the least significant bit (LSB) side of the path metric input data words and branch metric data words and on the most significant bit (MSB) side of the path metric input and branch metric data words. The Viterbi decoding ACS operation performed by the "VACS_DUAL16" ASE may be described by the following C code excerpt,

```
VACS_DUAL16 (&output1,&output2,input1,input2,bmetric)
{
lsb(output1) = max(lsb(input1)+lsb(bmetric),lsb(input2)–lsb(bmetric));
msb(output1) = max(lsb(input1)–lsb(bmetric),lsb(input2)+lsb(bmetric));
lsb(output2) = max(msb(input1)+msb(bmetric),msb(input2)–msb(bmetric));
msb(output2) = max(msb(input1)–msb(bmetric),msb(input2)+msb(bmetric));
}
```

A "VACS_QUAD8" ASE in accordance with an embodiment of the invention is configured to perform a Viterbi decoding ACS operation on eight eight-bit input data blocks packed in two thirty two-bit input data words using four eight-bit branch metric data blocks packed into a thirty two bit branch metric data word to generate eight eight-bit output data blocks packed in two thirty two-bit output data words. The "VACS_QUAD8" ASE performs the Viterbi decoding ACS operation in parallel on the LSB side of the input and branch metric data words and on the MSB side of the input and branch metric data words.

A "VDECISION_DUAL16" ASE in accordance with an embodiment of the invention is configured to process four sixteen-bit input data blocks packed into two thirty two-bit path metric input data words and also using two sixteen-bit branch metric data blocks packed into a thirty two-bit branch metric data word and a Viterbi decoding state number N, which is an integer that is greater or equal to zero and smaller than thirty two, to generate four Viterbi decoding decision bits for the four Viterbi decoding states, N, N+1, N+2, and N+3, where each Viterbi decoding decision bit is included in a thirty two-bit Viterbi decoding decision data word. The "VDECISION_DUAL16" ASE performs the Viterbi decoding operation in parallel on the LSB side of the path metric input and branch metric data words and on the MSB side of the path metric input and branch metric data words. The Viterbi decoding operation performed by the "VDECISION_DUAL16" ASE may be described by the following C code excerpt,

```
int VDECISION_DUAL16(input1,input2,bmetric,n)
{
UInt32 tmp1, tmp2, tmp3, tmp4, tmp5, tmp6, tmp7, tmp8;
UInt32 tmpdec1, tmpdec2, tmpdec3, tmpdec4;
tmp1 = lsb(input1) + lsb(bmetric);
tmp2 = lsb(input1) - lsb(bmetric);
tmp3 = lsb(input2) - lsb(bmetric);
tmp4 = lsb(input2) + lsb(bmetric);
tmp5 = msb(input1) + msb(bmetric);
tmp6 = msb(input1) - msb(bmetric);
tmp7 = msb(input2) - msb(bmetric);
tmp8 = msb(input2) + msb(bmetric);
tmpdec1 = tmp1 >= tmp3 ? 1<<n : 0;
tmpdec2 = tmp2 >= tmp4 ? 1<<n+1 : 0;
tmpdec3 = tmp5 >= tmp7 ? 1<<n+2 : 0;
tmpdec4 = tmp6 >= tmp8 ? 1<<n+3 : 0;
return tmpdec1\tmpdec2\tmpdec3\tmpdec4;
}
```

A "VDECISION_QUAD8" ASE in accordance with an embodiment of the invention is configured to process four eight-bit input data blocks using four eight-bit branch metric data blocks packed into a thirty two-bit branch metric data word and a Viterbi state data word to generate eight Viterbi decoding decision bits for the Viterbi decoding states N to N+7. The Viterbi state data word includes a state number N that is an integer greater or equal to zero and smaller than thirty two Each of the eight Viterbi decoding decision bits is included in a thirty two-bit Viterbi decoding decision data word.

Figure 9:
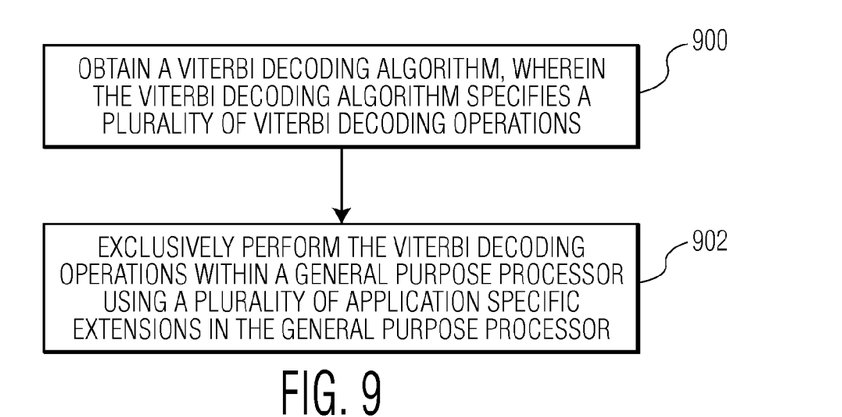
FIG. 9 is a schematic flow chart diagram of a method for Viterbi decoding using application specific extensions in accordance with an embodiment of the invention.

FIG. 9 is a schematic flow chart diagram of a method for Viterbi decoding using application specific extensions in accordance with an embodiment of the invention. At block 900, a Viterbi decoding algorithm is obtained, wherein the Viterbi decoding algorithm specifies a plurality of Viterbi decoding operations. At block 902, the plurality of Viterbi decoding operations are exclusively performed within a general purpose processor using a plurality of application specific extensions in the general purpose processor.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or illustrated include several components described or illustrated herein, other embodiments of the invention may include fewer or more components to implement less or more functionality.

Furthermore, the invention is not to be limited to the specific forms or arrangements of parts so described and illustrated. The scope of the invention is to be defined by the claims appended hereto and their equivalents.

What is claimed is:

1. A Viterbi decoding system comprising:
a non-transitory memory configured to store a Viterbi decoding algorithm, wherein the Viterbi decoding algorithm specifies a plurality of Viterbi decoding operations; and
a general purpose processor comprising a plurality of application specific extensions, wherein each application specific extension is configured to perform at least one of the plurality of Viterbi decoding operations specified in the Viterbi decoding algorithm stored in the non-transitory memory, and the Viterbi decoding system is configured such that all the Viterbi decoding operations specified in the Viterbi decoding algorithm are performed exclusively within the general purpose processor using at least one of the application specific extensions.

2. The Viterbi decoding system of claim 1, wherein a particular application specific extension of the plurality of application specific extensions is configured to perform a Viterbi decoding decision bits generating operation in parallel on least significant bit parts of two path metric input data words and most significant bit parts of the two path metric input data words and also using a branch metric data word to generate four decision bits for four Viterbi decoding states.

3. The Viterbi decoding system of claim 2, wherein each least significant bit part of the two input data words includes sixteen bits and each most significant bit part of the two input data words includes sixteen bits.

4. The Viterbi decoding system of claim 1, wherein a particular application specific extension of the plurality of application specific extensions is configured to perform a Viterbi decoding add-compare-select operation in parallel on least significant bit parts of two path metric input data words and a branch metric data word and most significant bit parts of the two path metric input data words and the branch metric data word to generate a first path metric output data word and a second path metric output data word.

5. The Viterbi decoding system of claim 1, wherein a particular application specific extension of the plurality of application specific extensions is configured to perform a Viterbi decoding bit interleaving operation on a first input data block and a second input data block to generate an output data word, each input data block has sixteen bits ranging from bit number zero to bit number fifteen, the first input data block and the second input data block being packed into an input data word that has thirty two bits, the output data word having thirty two bits ranging from bit number zero to bit number thirty one, the number I bit of the output data word being equal to the number (I−1)/2 bit of the second input data block, and the number J bit of the output data word being equal to the number J/2 bit of the first input data block, and I is an odd integer from one and thirty one and J is an even integer from zero and thirty.

6. The Viterbi decoding system of claim 1, wherein a particular application specific extension of the plurality of application specific extension is configured to perform a Viterbi decoding bit shift interleaving operation on a first input data block and a second input data block using a Viterbi decoding state number N to generate an output data word, each input data block has sixteen bits ranging from bit number zero to bit number fifteen, the first input data block and the second input data block being packed into a first input data word that has thirty two bits, N is an integer that is greater than or equal to zero and smaller than thirty one, the Viterbi decoding number N being in a second input data word that has thirty two bits, the output data word having thirty two bits ranging from bit number zero to bit number thirty one, the bit number N of the output data word is equal to the bit number zero of the first input data block, the bit number N+1 of the output data word being equal to the bit number zero of the second input data block, and all other bits of the output data words are reset to zero.

7. The Viterbi decoding system of claim 1, wherein a particular application specific extension of the plurality of application specific extensions is configured to process a current Viterbi decoding state and a Viterbi decoding decision bits to generate a next Viterbi decoding state, the next Viterbi decoding state is an upper Viterbi decoding state when the Viterbi decoding decision bit is set to zero, and the next Viterbi decoding state is a lower Viterbi decoding state when the Viterbi decoding decision bit is set to one.

8. The Viterbi decoding system of claim 1, wherein a particular application specific extension of the plurality of application specific extensions is configured to perform a Viterbi decoding branch metric calculating operation on a first input data block and a second input data block to generate a first output data block and a second output data block, each input data block has sixteen bits, the first input data block and the second input data block are packed into an input data word that has thirty two bits, each output data block has sixteen bits, the first output data block and the second output data block are packed into an output data word that has thirty two bits, the first output data block is equal to adding the first input data block to the second input data block, and the second output data block is equal to a difference between the first input data block and the second input data block.

9. A method for Viterbi decoding using application specific extensions, the method comprising:
obtaining a Viterbi decoding algorithm, wherein the Viterbi decoding algorithm specifies a plurality of Viterbi decoding operations; and
exclusively performing the plurality of Viterbi decoding operations within a general purpose processor using a plurality of application specific extensions in the general purpose processor.

10. The method of claim 9, wherein the exclusively performing further comprises:
performing a Viterbi decoding decision bits generating operation in parallel on least significant bit parts of two path metric input data words and most significant bit parts of the two path metric input data words; and
using a branch metric data word to generate four decision bits for four Viterbi decoding states using at least one of the application specific extensions in the general purpose processor.

11. The method of claim 9, wherein the exclusively performing further comprises:
performing a Viterbi decoding add-compare-select operation in parallel on least significant bit parts of two path metric input data words and a branch metric data word and most significant bit parts of the two path metric input data words and the branch metric data word to generate a first path metric output data word and a second path metric output data word using at least one of the application specific extensions in the general purpose processor.

12. The method of claim 9, wherein the exclusively performing further comprises:
performing a Viterbi decoding bit interleaving operation on a first input data block and a second input data block to generate an output data word using at least one of the application specific extensions in the general purpose processor, each input data block has sixteen bits ranging from bit number zero to bit number fifteen, the first input data block and the second input data block are packed into an input data word that has thirty two bits, the output data word has thirty two bits ranging from bit number zero to bit number thirty one, the number I bit of the output data word is equal to the number (I/1)/2 bit of the second input data block, and the number J bit of the output data word is equal to the number J/2 bit of the first input data block, I is an odd integer from one and thirty one, and J is an even integer from zero and thirty.

13. The method of claim 9, wherein the exclusively performing further comprises:
performing a Viterbi decoding bit shift interleaving operation on a first input data block and a second input data block using a Viterbi decoding state number N to generate an output data word using at least one of the application specific extensions in the general purpose processor, each input data block has sixteen bits ranging from bit number zero to bit number fifteen, the first input data block and the second input data block are packed into a first input data word that has thirty two bits, N is an integer that is greater than or equal to zero and smaller than thirty one, the Viterbi decoding state number N is in a second input data word that has thirty two bits, the output data word has thirty two bits ranging from bit number zero to bit number thirty one, the bit number N of the output data word is equal to the bit number zero of the first input data block, the bit number N+1 of the output data word is equal to the bit number zero of the second input data block, and all other bits of the output data words are reset to zero.

14. The method of claim 9, wherein the exclusively performing further comprises:
processing a current Viterbi decoding state and a Viterbi decoding decision bits to generate a next Viterbi decoding state using at least one of the application specific extensions in the general purpose processor, wherein the next Viterbi decoding state is an upper Viterbi decoding state when the Viterbi decoding decision bit is set to zero and a lower Viterbi decoding state when the Viterbi decoding decision bit is set to one.

15. The method of claim 9, wherein the exclusively performing further comprises:
performing a Viterbi decoding branch metric calculating operation on a first input data block and a second input data block to generate a first output data block and a second output data block using at least one of the application specific extensions in the general purpose processor, wherein each input data block has sixteen bits, the first input data block and the second input data block are packed into an input data word that has thirty two bits, each output data block has sixteen bits, the first output data block and the second output data block are packed into an output data word that has thirty two bits, the first output data block is equal to adding the first input data block and the second input data block, and the second output data block is equal to a difference between the first input data block and the second input data block.

16. A Viterbi decoding system comprising:
a non-transitory memory configured to store a Viterbi decoding algorithm, wherein the Viterbi decoding algorithm specifies a plurality of Viterbi decoding operations; and
a general purpose processor comprising a processor core and a plurality of application specific extensions, wherein the processor core includes a plurality of functional units and each application specific extension is configured to perform one of the Viterbi decoding operations specified in the Viterbi decoding algorithm stored in the non-transitory memory, and the Viterbi decoding system is configured such that all the Viterbi decoding operations specified in the Viterbi decoding algorithm are performed exclusively within the general purpose processor using at least one of the application specific extensions.

17. The Viterbi decoding system of claim 16, wherein the plurality of functional units further comprise:
   an addition/subtraction functional unit configured to perform addition functions and subtraction functions;
   a multiplication functional unit configured to perform multiplication functions; and
   an arithmetic logic functional unit configured to perform logic functions.

18. The Viterbi decoding system of claim 16, wherein the plurality of application specific extensions are configured to reuse at least one of the functional units of the processor core.

19. The Viterbi decoding system of claim 16, wherein a particular application specific extension of the plurality of application specific extensions is configured to perform a Viterbi decoding decision bits generating operation in parallel on least significant bit parts of two path metric input data words and most significant bit parts of the two path metric input data words and also using a branch metric data word to generate four decision bits for four Viterbi decoding states.

20. The Viterbi decoding system of claim 16, wherein a particular application specific extension of the plurality of application specific extensions is configured to perform a Viterbi decoding add-compare-select operation in parallel on least significant bit parts of two path metric input data words and a branch metric data word and most significant bit parts of the two path metric input data words and the branch metric data word to generate a first path metric output data word and a second path metric output data word.

* * * * *